(12) United States Patent
Buczek et al.

(10) Patent No.: US 7,106,156 B2
(45) Date of Patent: Sep. 12, 2006

(54) SUPERCONDUCTOR CABLES AND MAGNETIC DEVICES

(75) Inventors: David M. Buczek, Dover, MA (US); John D. Scudiere, Bolton, MA (US); Leslie G. Fritzemeier, Mendon, MA (US)

(73) Assignee: American Superconductor Corporation, Westborough, MA (US)

( * ) Notice: Subject to any disclaimer, the term of this patent is extended or adjusted under 35 U.S.C. 154(b) by 0 days.

(21) Appl. No.: 11/104,194

(22) Filed: Apr. 12, 2005

(65) Prior Publication Data

US 2005/0181954 A1   Aug. 18, 2005

Related U.S. Application Data

(63) Continuation of application No. 10/853,547, filed on May 25, 2004, now Pat. No. 6,943,656, which is a continuation of application No. 09/995,442, filed on Nov. 28, 2001, now Pat. No. 6,745,059.

(51) Int. Cl.
    *H01F 1/00*   (2006.01)
(52) U.S. Cl. ............... 335/216; 335/219; 335/299
(58) Field of Classification Search ........... 335/216, 335/299; 505/704, 705
    See application file for complete search history.

(56) References Cited

U.S. PATENT DOCUMENTS

| | | | | |
|---|---|---|---|---|
| 4,028,488 A | * | 6/1977 | McDougall | 174/125.1 |
| 4,195,199 A | * | 3/1980 | Hillmann et al. | 174/125.1 |
| 4,397,807 A | * | 8/1983 | Bahder et al. | 264/512 |
| 4,994,435 A | | 2/1991 | Shiga et al. | 335/216 |
| 5,104,849 A | | 4/1992 | Shiga et al. | 335/216 |
| 5,202,305 A | | 4/1993 | Watanabe et al. | 335/216 |
| 5,231,074 A | | 7/1993 | Cima et al. | 505/1 |
| 5,232,908 A | | 8/1993 | Shiga et al. | 335/216 |
| 5,801,124 A | | 9/1998 | Gamble et al. | 505/230 |
| 5,912,607 A | * | 6/1999 | Kalsi et al. | 335/216 |
| 6,022,832 A | | 2/2000 | Fritzemeier et al. | 505/461 |
| 6,027,564 A | | 2/2000 | Fritzemeier et al. | 117/89 |
| 6,081,987 A | * | 7/2000 | Kalsi et al. | 29/599 |
| 6,121,205 A | * | 9/2000 | Murakami et al. | 505/234 |
| 6,190,752 B1 | | 2/2001 | Do et al. | 428/141 |
| 6,444,917 B1 | * | 9/2002 | Scudiere et al. | 174/125.1 |
| 6,507,746 B1 | * | 1/2003 | Kaneko | 505/231 |
| 6,794,970 B1 | * | 9/2004 | Reis et al. | 335/216 |
| 2004/0102329 A1 | * | 5/2004 | Mele | 505/100 |

FOREIGN PATENT DOCUMENTS

| | | |
|---|---|---|
| EP | 0 312 015 A2 | 4/1989 |
| EP | 0 423 354 A1 | 4/1991 |
| EP | 0 623 937 A2 | 11/1994 |
| JP | 01-276511 | 11/1989 |
| JP | 04203861 | 2/1994 |

(Continued)

OTHER PUBLICATIONS

Azoulay, Jacob. "Low-temperature solid-state reacion *in situ* growth of $YBA_2Cu_3O_{7-\delta}$ thin films by resistive evaporation." *Journal of Applied Physics* 72:11, p. 5341-5343. Dec. 1, 1992.

(Continued)

*Primary Examiner*—Elvin G. Enad
*Assistant Examiner*—Bernard Rojas
(74) *Attorney, Agent, or Firm*—Fish & Richardson P.C.

(57) ABSTRACT

Superconducting cables and magnetic devices are disclosed.

4 Claims, 5 Drawing Sheets

FOREIGN PATENT DOCUMENTS

| | | |
|---|---|---|
| WO | WO 98/58415 | 12/1998 |
| WO | WO 99/14770 | 3/1999 |
| WO | WO 99/16941 | 4/1999 |
| WO | WO 99/17307 | 4/1999 |
| WO | WO 00/39812 | 7/2000 |
| WO | WO 00/58044 | 10/2000 |
| WO | WO 00/58530 | 10/2000 |
| WO | WO 01/08169 | 2/2001 |
| WO | WO 01/08170 | 2/2001 |
| WO | WO 01/08232 | 2/2001 |
| WO | WO 01/08233 | 2/2001 |
| WO | WO 01/08233 A2 | 2/2001 |
| WO | WO 01/08235 | 2/2001 |
| WO | WO 01/08236 | 2/2001 |
| WO | WO 01/26164 | 4/2001 |
| WO | WO 01/26165 | 4/2001 |
| WO | WO 02/15203 A1 | 2/2002 |
| WO | WO 02/35615 | 5/2002 |

OTHER PUBLICATIONS

Mankiewich, P.M. et al. "High critial-current density $Ba_2YCu_3O_7$ thin films produced by coevaporation of Y, Cu, and $BaF_2$." Mat. Rea. Soc. Symp. Proc. 99, pp. 119-125. Nov. 30-Dec. 4, 1987.

Wang, X.K. et al. "Oriented thin films of YBACU(F)O with high $T_c$ and $J_c$ prepared by electron beam multilayer evaporation." *Applied Physics Letters, American Institute of Physics*: 54:16 pp. 1573. Apr. 17, 1989.

Abstract of JP 9-120720.
Abstract of JP 5-81941.
Abstract of JP 5-47242.
Abstract of JP 5-89727.
Abstract of JP 6-314609.
Abstract of JP 7-114838.
Abstract of JP 7-45136.
Abstract of JP 4-292808.
Office Action received in Japanese Application No. 2003-548322, dated Aug. 16, 2005.

\* cited by examiner

SUPERCONDUCTOR CABLES AND MAGNETIC DEVICES

CROSS-REFERENCE TO RELATED APPLICATIONS

This application is a continuation application of and claims priority to U.S. application Ser. No. 10/853,547, filed May 25, 2004, now U.S. Pat No. 6,943,656 which is a continuation of U.S. application Ser. No. 09/995,442, filed on Nov. 28, 2001, now U.S. Pat. No. 6,745,059, which are incorporated by reference.

INCORPORATION BY REFERENCE

The following documents are hereby incorporated by reference: U.S. Pat. No. 5,231,074, issued on Jul. 27, 1993, and entitled "Preparation of Highly Textured Oxide Superconducting Films from MOD Precursor Solutions," U.S. Pat. No. 6,022,832, issued Feb. 8, 2000, and entitled "Low Vacuum Process for Producing Superconductor Articles with Epitaxial Layers," U.S. Pat. No. 6,027,564, issued Feb. 22, 2000, and entitled "Low Vacuum Process for Producing Epitaxial Layers," U.S. Pat. No. 6,190,752, issued Feb. 20, 2001, and entitled "Thin Films Having Rock-Salt-Like Structure Deposited on Amorphous Surfaces," PCT Publication No. WO 00/58530, published on Oct. 5, 2000, and entitled "Alloy Materials," PCT Publication No. WO/58044, published on Oct. 5, 2000, and entitled "Alloy Materials," PCT Publication No. WO 99/17307, published on Apr. 8, 1999, and entitled "Substrates with Improved Oxidation Resistance," PCT Publication No. WO 99/16941, published on Apr. 8, 1999, and entitled "Substrates for Superconductors," PCT Publication No. WO 98/58415, published on Dec. 23, 1998, and entitled "Controlled Conversion of Metal Oxyfluorides into Superconducting Oxides," commonly owned U.S. patent application Ser. No. 09/616,860, filed on Jul. 14, 2000, and entitled "Superconductor Articles and Compositions and Methods for Making Same," commonly owned U.S. patent application Ser. No. 09/615,991, filed on Jul. 14, 2000, and entitled "Methods and Compositions for Making a Multi-layer Article," commonly owned U.S. patent application Ser. No. 09/618,811, filed on Jul. 14, 2000, and entitled "Methods of Making A Superconductor," commonly owned U.S. patent application Ser. No. 09/694,400, filed on Oct. 23, 2000, and entitled "Precursor Solutions and Methods of Using Same," commonly owned U.S. patent application Ser. No. 09/500,717, filed on Feb. 9, 2000, and entitled "Coated Conductor Thick Film Precursor," commonly owned U.S. patent application Ser. No. 09/616,566, filed on Jul. 14, 2000, and entitled "Control of Oxide Layer Reaction Rates," commonly owned U.S. patent application Ser. No. 09/617,518, filed on Jul. 14, 2000, and entitled "Enhanced High Temperature Coated Superconductors," commonly owned U.S. patent application Ser. No. 09/617,520, filed on Jul. 14, 2000, and entitled "Enhanced Purity Oxide Layer Formation," commonly owned U.S. patent application Ser. No. 09/615,669, filed on Jul. 14, 2000, and entitled "Oxide Layer Method," commonly owned U.S. patent application Ser. No. 09/615,999, filed on Jul. 14, 2000, and entitled "Multi-layer Articles and Methods of Making Same," commonly owned U.S. patent application Ser. No. 09/500,718, filed on Feb. 9, 2000, and entitled "Coated Conductors with Reduced AC Loss," commonly owned U.S. patent application Ser. No. 09/855,312, filed on May 14, 2001, and entitled "Precursor Solutions and Methods of Using Same," commonly owned U.S. patent application Ser. No. 09/918,167, filed on Jul. 30, 2001, and entitled "Ion Texturing Methods and Articles," commonly owned U.S. Provisional Patent Application Ser. No. 60/305,478, filed Jul. 13, 2001, and entitled "Low Stress Superconductor," and commonly owned U.S. Provisional Patent Application Ser. No. 60/308,957, filed on Jul. 31, 2001, and entitled "Superconductor Methods And Reactors."

TECHNICAL FIELD

The invention relates to superconductor cables and magnetic devices.

BACKGROUND

Multi-layer superconductor articles, such as tapes, having various architectures have been developed. Such articles often include a substrate and a superconductor layer. Typically, one or more buffer layers are disposed between the substrate and the superconductor layer.

SUMMARY

In general, the invention relates to superconductor cables and magnetic devices.

In one aspect, the invention features an article that includes a first layer formed of a first superconductor material and a second layer formed of a first electrically conductive material. The article also includes a third layer formed of a second superconductor material and a fourth layer formed of a second electrically conductive material. The second layer is mechanically coupled to the first layer (e.g., mechanically coupled at points other than their ends), and the fourth layer is mechanically coupled to the third layer (e.g., mechanically coupled at points other than their ends). The second and fourth layers are in electrical communication. The first and second layers have a neutral mechanical axis when bent that is different than the neutral mechanical axis of the third and fourth layers when bent.

The phrase "mechanically coupled," as used herein, refers to a force between (e.g., at the interface of) two layers that substantially reduces (e.g., eliminates) the ability of one layer to move independently of the other layer. One example of mechanically coupled layers is two layers that are chemically bonded together. Another example of mechanically coupled layer is two layers that are metallurgically bonded together. An additional example of mechanically coupled layers is two layers that are each adhered to an adhesive layer therebetween. It is to be noted that two layers (or other articles, such as tapes) generally are not mechanically coupled when the layers (or articles) are held in compression against each other by a force acting from outside (as opposed to at the interface of) the two layers. For example, if two tapes are wrapped within insulation that provides a compressive force that holds the tapes in proximity to each other, this force itself does not render the tapes mechanically coupled, although the tapes may otherwise be mechanically coupled (e.g., if the tapes are chemically or metallurgically bonded to each other).

The article can be configured so that the second and fourth layers can move independently of each other.

The first and second superconductor materials can be the same or different. For example, one or both of the superconductor materials can be a rare earth superconductor material, such as YBCO.

The first and second electrically conductive materials can be the same or different. For example, the first and second electrically conductive materials can be a metal (e.g., copper) or an alloy (e.g., a copper alloy).

The first and second layers can be in the form of a tape. The second and third layers can be in the form of a tape.

The article can further include first and second substrates. The first layer can be between the first substrate and the second layer, and the third layer can be between the second substrate and the fourth layer.

The article can further include first and second buffer layers. The first buffer layer can be between the first substrate and the first layer, and the second buffer layer can be between the second substrate and the third layer.

In some embodiments, the first substrate layer has a thickness that is about equal to a combined thickness of the first layer, the first buffer layer, and the second layer.

In certain embodiments, the fourth layer has a thickness that is about equal to a combined thickness of the third layer, the second buffer layer, and the second substrate layer.

The article can further include first and second cap layers. The first cap layer can be between the first and second layers, and the second cap layer can be between the third and fourth layers.

The article can further include an interfacial layer between the second and fourth layers. The interfacial layer is generally formed of an electrically conductive material and can be, for example, capable of reducing oxidation of the second and fourth layers, and/or reducing friction between the second and the fourth layer. In some embodiments, the interfacial layer is at least partially formed or graphite.

In another aspect, the invention features an article (e.g., a cable) that includes first and second helically wound superconductor tapes. The first tape includes a superconductor layer and an electrically conductive layer, and the second tape that includes a superconductor layer and an electrically conductive layer. The electrically conductive layers of the first and second tapes ar in electrical communication (e.g., in electrical communication at more than one position, such as by contacting each other in more than one location). The first helically wound superconductor tape has a neutral mechanical axis, and the second helically wound superconductor tape has a different neutral mechanical axis.

The first and second helically wound tapes can be configured so that they can move independently of each other.

The article can further include a forming element around which the first and second tapes are helically wound.

In some embodiments, the superconductor layers of the first and/or second superconductor tapes are mechanically compressed.

The first and second helically wound superconductor tapes can have a common helical axis.

In some embodiments, the article further includes third and fourth helically wound superconductor tapes. The third helically wound superconductor tape includes a superconductor layer and an electrically conductive layer, and the fourth helically wound superconductor tape includes a superconductor layer and an electrically conductive layer. The electrically conductive layers of the third and fourth superconductor tapes have more than one point of electrical communication (e.g., by contacting each other in more than one location). The third and fourth helically wound superconductor tapes can have a common helical axis.

In certain embodiments, the electrically conductive layers of the first and second superconductor tapes at least partially overlap. In some embodiments, the electrically conductive layers of the first and second superconductor tapes substantially entirely overlap.

In a further aspect, the invention features an article that includes first and second pluralities of helically wound tapes. In the first plurality of helically wound superconductor tapes, each tape includes a layer of a superconductor material and a layer of an electrically conductive material, and each tape is wound in parallel in a first direction. In the second plurality of helically wound superconductor tapes, each tape includes a layer of a superconductor material and a layer of an electrically conductive material, and each tape is wound in parallel in a second direction opposite the first direction. The layer of the electrically conductive materials in each tape in the first plurality of tapes has more than one position of electrical communication with the layer of electrically conductive material in each tape of the second plurality of tapes (e.g., by contacting each other in more than one location).

In some embodiments, the first and second pluralities of helically wound superconductor tapes have a common helical axis.

In certain embodiments, the electrically conductive layers of each tape in the first plurality of superconductor tapes at least partially overlap with the electrically conductive layers of each tape in the second plurality of superconductor tapes.

Each of the tapes in the article can have a different neutral mechanical axis when bent than the neutral mechanical axis of any of the other tapes when bent.

In an additional aspect, the invention features a superconducting magnetic coil that includes first and second coiled superconductor tapes. Each coiled superconductor tape is coiled about a respective coil axis. The first coiled superconductor tape includes a superconductor layer and an electrically conductive layer. The electrically conductive layer of the first coiled superconductor tape has a surface that forms an inner surface of the first coiled superconductor tape. The inner surface of the first coiled superconductor tape faces the coil axis of the first coiled superconductor tape. The second coiled superconductor includes a superconductor layer and an electrically conductive layer. The electrically conductive layer of the second coiled superconductor tape has a surface that forms an outer surface of the second coiled superconductor tape. The outer surface of the second coiled superconductor tape faces away from the coil axis of the second coiled superconductor tape. The first and second coiled superconductor tapes are configured so that inner surface of the first superconductor tape is adjacent the outer surface of the second superconductor tape.

The first and second superconductor tapes in the magnetic coil can have different neutral mechanical axes from each other.

In some embodiments, the first and second coiled superconductor tapes contact each other.

In certain embodiments, the first and second coiled superconductor tapes are wound together.

In some embodiments, the coil axis of the first superconductor tape is the same as the coil axis of the second superconductor tape.

In certain embodiments, the first and second superconductor tapes are coiled about each other.

In some embodiments, the superconductor layer and electrically conductive layer of the first superconductor tape are mechanically coupled (e.g., mechanically coupled at points other than their ends), and the superconductor layer and electrically conductive layer of the second superconductor tape are mechanically coupled (e.g., mechanically coupled at points other than their ends).

In certain embodiments, the superconductor layers of the first and/or second superconductor tapes are mechanically compressed.

The superconducting magnetic coil can further include an interfacial layer disposed between the adjacent first and second superconductor tapes.

The superconducting magnetic coil can further include third and fourth coiled superconductor tapes. Each of the third and fourth coiled superconductor tapes is coiled about a respective coil axis. The third coiled superconductor tape includes a superconductor layer and an electrically conductive layer. The electrically conductive layer of the third coiled superconductor tape has a surface that forms an inner surface of the third coiled superconductor tape. The inner surface of the third coiled superconductor tape faces the coil axis of the third coiled superconductor tape. The fourth coiled superconductor includes a superconductor layer and an electrically conductive layer. The electrically conductive layer of the fourth coiled superconductor tape has a surface that forms an outer surface of the fourth coiled superconductor tape. The outer surface of the fourth coiled superconductor tape faces away from the coil axis of the fourth coiled superconductor tape. The third and fourth coiled superconductor tapes are configured so that inner surface of the third superconductor tape is adjacent the outer surface of the fourth superconductor tape.

The architecture of the superconductor articles (e.g., tapes, cables and/or magnetic coils) can allow multiple superconductor layers to simultaneously be compressed (e.g., by being at or below the neutral mechanical axis) when the articles are bent.

The architecture of the superconductor articles (e.g., tapes, cables and/or magnetic coils) can reduce the risk of reduced current density due to, for example, the presence of defects (e.g., localized defects, such as a crack a grain boundary, or the like) in one or more of the superconductor layers.

The architecture of the superconductor articles (e.g., tapes, cables and/or magnetic coils) can result in current sharing through, for example, redundant conducting paths, lower hysteretic losses under alternating current conditions, enhanced electrical stability, and/or enhanced thermal stability.

The architecture of the superconductor articles (e.g., tapes, cables and/or magnetic coils) can result in a favorable stress profile and/or improved mechanical properties.

The architecture of the superconductor articles (e.g., tapes, cables, and/or magnetic coils) can provide improved mechanical stability, improved electrical stability, enhanced current carrying capacity, and/or favorable economy of manufacture.

The architecture of the superconductor articles (e.g., tapes, cables and/or magnetic coils) can reduce mechanical degradation of the operational superconductor layer(s) during bending.

The architecture of the superconductor articles (e.g., tapes, cables and/or magnetic coils) can make it relatively easy to splice the articles.

The architecture of the superconductor articles (e.g., tapes, cables and/or magnetic coils) can make it relatively easy to achieve termination of tape stack ups and/or conductor elements.

The architecture of the superconductor articles (e.g., tapes, cables and/or magnetic coils) can reduce heating due to, for example, localized defects in the superconductor material.

The superconductor articles (e.g., tapes, cables and/or magnetic coils) can be used in a variety of applications, including, for example, electrical, magnetic, electro-optic, dielectric, thermal, mechanical, and/or environmental (e.g., protective) applications.

Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
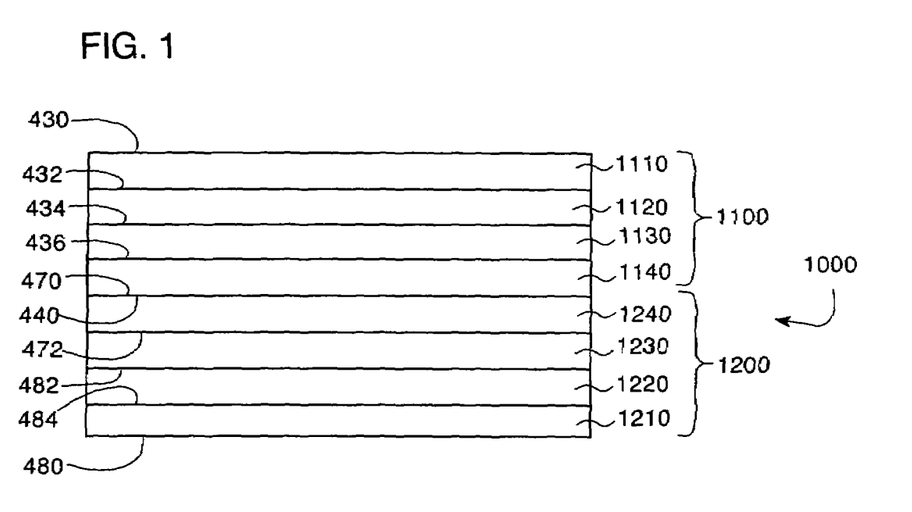
FIG. 1 is a cross-sectional view of an embodiment of a superconductor article including two superconductor tapes.

FIG. 1 shows a cross-sectional view of an embodiment of a superconductor article 1000 that includes multi-layer superconductor tapes 1100 and 1200. Tape 1100 includes a substrate 1110, a buffer layer 1120, a superconductor layer 1130, and an electrically conducting stabilizer layer 1140. Similarly, tape 1200 includes a substrate 1210, a buffer layer 1220, a superconductor layer 1230, and an electrically conducting stabilizer layer 1240. The layers within tapes 1100 and 1200 are mechanically coupled (e.g., chemically bonded or metallurgically bonded) to their corresponding neighboring layers (e.g., mechanically coupled at points other than their ends), but tapes 1100 and 1200 are configured so that they can move independently of each other because, while stabilizer layers 1140 and 1240 contact each other and are in electrical communication, surface 440 of stabilizer layer 1140 is not mechanically coupled (e.g., is not chemically bonded or metallurgically bonded) to surface 470 of stabilizer layer 1240.

With the architecture of article 1000, electrical current can readily propagate along and between tapes 1100 and 1200, even if a localized defect is present in superconductor layers 1130 and/or 1230. For example, in the case that a localized defect (e.g., a crack, a grain boundary, or the like) is present in superconductor layer 1130, electrical current in the vicinity of the defect can be shunted through stabilizer layers 1140 and 1240 and into superconductor layer 1230. Likewise, if a localized defect is present in superconductor layer 1230, electrical current in the vicinity of the defect can be shunted through stabilizer layers 1240 and 1140 and into superconductor layer 1130. This can enhance both the electrical stability and/or the current carrying capacity of article 1000 compared to certain other superconductor articles in which the superconductor layers in neighboring tapes are not in electrical communication with each other.

Moreover, the architecture of article 1000 can provide enhanced electrical stability and/or enhanced current carrying capacity even in the absence of localized defects in one of superconductor layers 1130 and/or 1230 because these layers are in electrical communication with each other via stabilizer layers 1140 and 1240, thereby increasing the volume of electrically conductive (including superconductive) material in electrical communication in article 1000 relative to other systems in which the superconductor layers of neighboring tapes are not in electrical communication with each other.

In addition, by allowing tapes 1100 and 1200 to move independently of each of other, tapes 1100 and 1200 can be designed so that, when exposed to certain conditions of stress (e.g., when bent, such as when formed in a cable or a magnetic coil), they each have their own neutral mechanical axis (i.e., lowest strain region). This is shown, for example, in FIG. 2 where tapes 1100 and 1200 are bent. Tape 1100 has a neutral mechanical axis 1150, and tape 1200 has a neutral mechanical axis 1250. Without wishing to be bound by theory, it is believed that superconductor layers 1130 and 1230 have a higher critical current density when compressed than when expanded. Because tapes 1100 and 1200 have independent neutral mechanical axes, tapes 1100 and 1200 can be designed so that, when bent, superconductor layers 1130 and 1230 are located at or below neutral mechanical axes 1150 and 1250, respectively. This allows superconductor layers 1130 and 1230 to simultaneously be in a compressed state when tapes 1100 and 1200 are bent.

In some embodiments, the distance the superconductor layer is from the neutral mechanical axis is less than about 10 percent (e.g., less than about nine percent, less than about eight percent, less than about seven percent, less than about six percent, less than about five percent, less than about four percent, less than about three percent, less than about two percent, less than about one percent) of the thickness of the tape.

Figure 2:
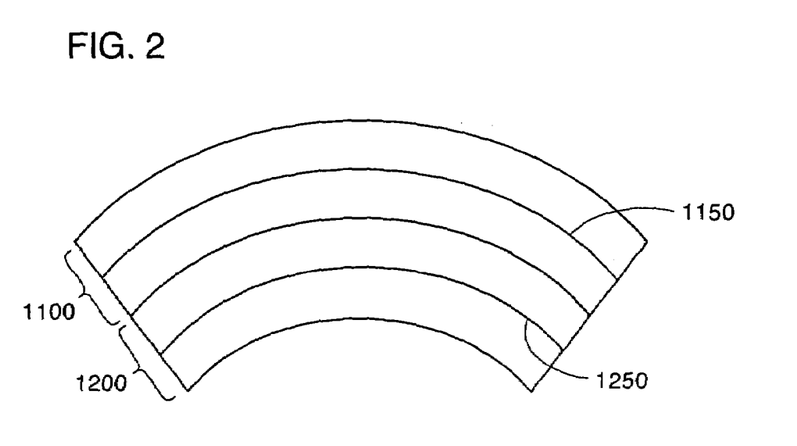
FIG. 2 is a cross-sectional view of an embodiment of the superconductor article of FIG. 1 when bent.

In certain embodiments, the thickness of the layers in tapes 1100 and/or 1200 can be selected so that, when tapes 1100 and/or 1200 are bent, superconductor layers 1130 and/or 1230, respectively, are at or below neutral mechanical axes 1150 and/or 1250, respectively. As an example, in some embodiments, the thickness of substrate 1110 is about the same as or greater than the combined thickness of the of stabilizer layer 1140, superconductor layer 1130 and buffer layer 1120. For example, the thickness of substrate 1110 can be at least about one percent greater (e.g., at least about two percent greater, at least about three percent greater, at least about four percent greater, at least about five percent greater, at least about eight percent greater, at least about 10 percent greater) than the combined thickness layers 1140, 1130 and 1120. As another example, in certain embodiments, the thickness of stabilizer layer 1240 is about the same as or greater than the combined thickness of the of substrate 1210, buffer layer 1220, and superconductor layer 1230. For example, the thickness of layer 1240 can be at least about one percent greater (e.g., at least about two percent greater, at least about three percent greater, at least about four percent greater, at least about five percent greater, at least about eight percent greater, at least about 10 percent greater) than the combined thickness layers 1210, 1220 and 1230.

In some embodiments, layer 1110 is from about 20 microns to about 80 microns thick (e.g., from about 30 microns to about 70 microns thick, from about 40 microns to about 60 microns thick, about 50 microns thick).

In certain embodiments, layer 1120 is from about 0.1 micron to about 0.5 micron thick (e.g., from about 0.2 micron to about 0.4 micron thick, about 0.3 micron thick).

In some embodiments, layer 1130 is from about 0.7 micron to about 1.3 microns thick (e.g., from about 0.8 micron to about 1.2 microns thick, from about 0.9 micron to about 1.1 microns thick, about one micron thick).

In certain embodiments, layer 1140 is from about 45 microns to about 51 microns thick (e.g., from about 46 microns to about 50 microns thick, from about 47 microns to about 49 microns thick, about 48.7 microns thick).

In some embodiments, layer 1210 is from about 20 microns to about 80 microns thick (e.g., from about 30 microns to about 70 microns thick, from about 40 microns to about 60 microns thick, about 50 microns thick).

In certain embodiments, layer 1220 is from about 0.1 micron to about 0.5 micron thick (e.g., from about 0.2 micron to about 0.4 micron thick, about 0.3 micron thick).

In some embodiments, layer 1230 is from about 0.7 micron to about 1.3 microns thick (e.g., from about 0.8 micron to about 1.2 microns thick, from about 0.9 micron to about 1.1 microns thick, about one micron thick).

In certain embodiments, layer 1240 is from about 48 microns to about 53 microns thick (e.g., from about 49 microns to about 52 microns thick, from about 50 microns to about 52 microns thick, about 51.3 microns thick).

Substrates 1110 and 1210 are typically formed of conventional substrate materials. Such materials include, for example, metals and alloys, such as nickel, silver, copper, zinc, aluminum, iron, chromium, vanadium, palladium, molybdenum or their alloys.

Buffer layers 1120 and 1220 are generally formed of conventional buffer layer materials. Examples of such materials include metals, metal oxides and/or metal oxides, such as silver, nickel, $CeO_2$, $Y_2O_3$, $TbO_x$, $GaO_x$, yttria stabilized zirconia (YSZ), $LaAlO_3$, $SrTiO_3$, $Gd_2O_3$, $LaNiO_3$, $LaCuO_3$, $SrTuO_3$, $NdGaO_3$, $NdAlO_3$, MgO, AlN, NbN, TiN, VN and ZrN.

In general, superconductor layers 1130 and 1240 are formed of rare earth oxide superconductor materials. Examples of such materials include rare earth copper oxide superconductors, such as rare earth barium copper oxides (e.g., YBCO, GdBCO and ErBCO).

Typically, the substrate/buffer layer/superconductor layer arrangement in tapes 1100 and 1200 is formed via epitaxial growth. Accordingly, surfaces 432, 434 and 436 of substrate 1110, buffer layer 1120 and superconductor layer 1130, respectively, are usually textured (e.g., biaxially textured or cube textured). Similarly, surfaces 484, 482 and 470 of substrate 1210, buffer layer 1220 and superconductor layer 1230, respectively, are usually textured (e.g., biaxially textured or cube textured).

Stabilizer layers 1140 and 1240 are generally formed of electrically conductive materials, such as metals and/or alloys. Examples of materials from which layers 1140 and 1240 can be formed include copper, nickel, silver and alloys thereof.

Generally, a tape has a length dimension that is substantially greater than its width or breadth. Exemplary dimensions are micrometers to hundreds of micrometers in height (e.g., at least one micrometer, at least two micrometers, at least five micrometers, at least 10 micrometers, at least 20 micrometers, at least 50 micrometers, at least 100 micrometers, at least 200 micrometers, at least 1000 micrometers), millimeters to centimeters in width (e.g., at least one millimeter, at least two millimeters, at least five millimeters, at least 10 millimeters, at least 20 millimeters), and fractions of a meter to thousands of meters in length (e.g., at least 0.01 meter, at least 0.2 meters, at least 0.1 meters, at least 1 meter, at least 10 meters, at least 100 meters).

Figure 3:
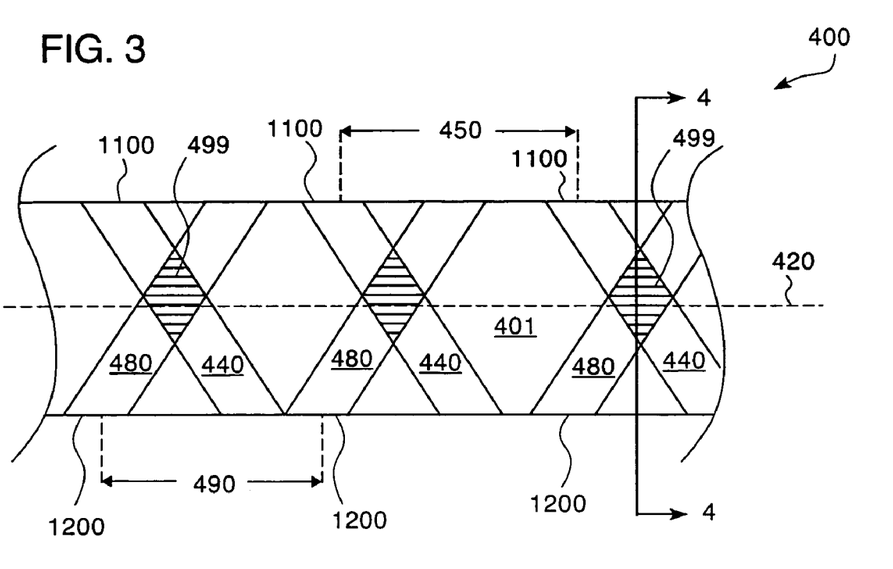
FIG. 3 is a plan view of an embodiment of a superconductor tape.
Figure 4:
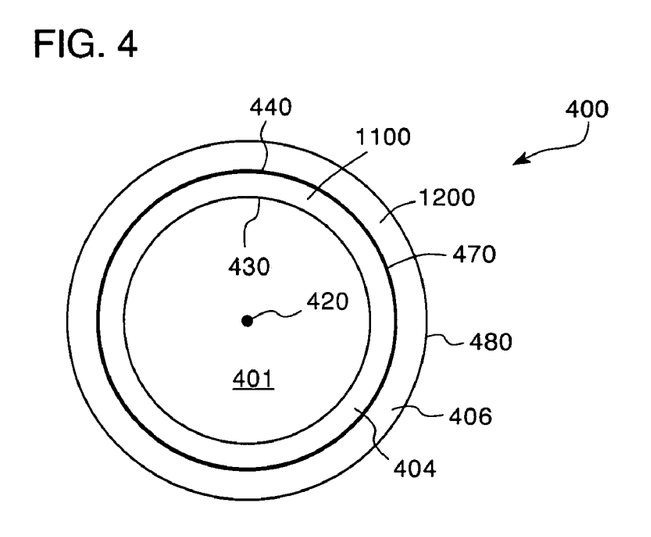
FIG. 4 is a cross-sectional view of the superconductor tape of FIG. 3.

In some embodiments, superconductor tapes 1100 and 1200 can be included in superconductor cables. FIGS. 3 and 4 show plan and cross-sectional views, respectively, of a portion of an embodiment of a superconductor cable 400 in which a layer 404 of cable 400 is formed from superconductor tape 1100 and a layer 406 of cable 400 is formed from superconductor tape 1200. Tapes 1100 and 1200 are configured to move relatively independent of each other (e.g., they are not mechanically coupled to each other). Tape 1100 is helically wound around a helical axis 420 so that surface 430 of tape 1100 faces toward helical axis 420 and surface 440 of tape 1100 faces away from helical axis 420. The helix formed by tape 1100 has a helical pitch 450, which corresponds to the distance along helical axis 420 in which tape 1100 is wound through 360°. Generally, pitch 450 can be varied as desired. As an example, pitch 450 can be about equal to the width of tape 1100 so that alternate windings of tape 1100 are adjacent each other. As another example, pitch 450 can be much longer or shorter than the width of tape 1100.

Tape 1200 is helically wound over the tape 1100 and around helical axis 420 in the opposite direction to tape 1100. Tape 1200 is wound with surface 470 facing toward helical axis 420 and surface 480 facing away from helical axis 420. Tape 1200 has a helical pitch 490 which can generally be varied as desired. As an example, helical pitch 490 can be about equal to the width of tape 1200 so that alternate windings of tape 1200 are adjacent each other. Helical pitch 490 can be about the same as, shorter than, or longer than helical pitch 450.

Surface 470 of tape 1200 contacts surface 440 of tape 1100 periodically along the cable at points 499. Points 499 typically are points of electrical communication between tapes 1100 and 1200, allowing electrical current to pass between tapes 1100 and 1200 via stabilizer layers 1140 and 1240.

Referring to FIG. 4, cable 400 can be formed by winding tapes 1100 and 1200 around a forming element 401. Optionally, forming element 401 can be removed after winding, or can remain as a structural component of cable 400. Optionally or additionally, forming element 401 can be used to supply a cryogenic fluid to cable 400 in order to cool tapes 1100 and/or 1200 (e.g., to a temperature that is about the same as or below the critical temperature of superconductor layers 1130 and/or 1230).

While embodiments have been described in which each layer of a superconductor tape is formed by a helically winding a single tape around a helical axis in a given direction, the invention is not so limited.

Figure 5A:
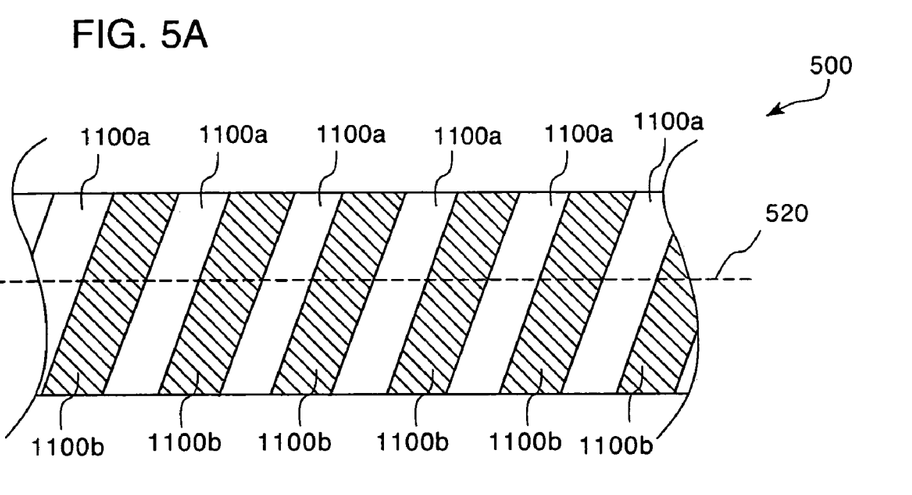
FIG. 5A is a plan view of an embodiment of a superconductor tape.
Figure 5B:
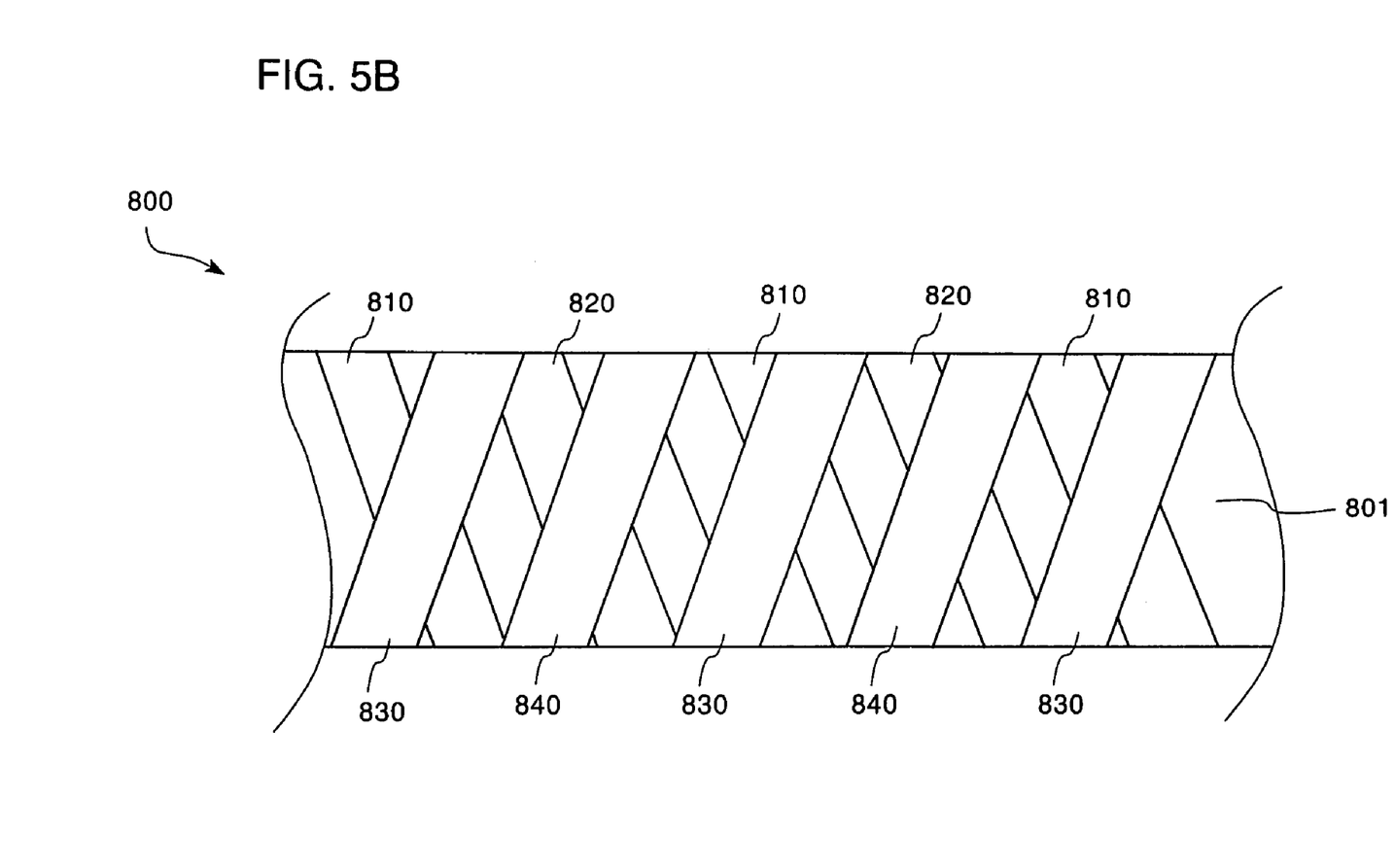
FIG. 5B is a plan view of an embodiment of a superconductor tape.

As an example, more than one (e.g., two, three, four, five, six, seven, eight, etc.) superconductor tapes can be helically wound beside each other in the same direction around a helical axis to form a layer of a superconductor tape. FIG. 5A is a plan view of an embodiment of a layer of a cable 500 that includes two superconductor tapes 1100a and 1100b that are helically wound beside each other about a helical axis 520 in the same direction. FIG. 5B is a plan view of an embodiment of a superconductor cable 800, including four tapes 810, 820, 830, and 840. Two tapes, 810 and 820, are wound in a first helical direction around a forming element 801. Tape 810 and tape 820 are wound parallel. Two additional tapes, 830 and 840, are wound in a second helical direction, opposite the first helical direction, around forming element 801 on top of tapes 810 and 820. Tapes 830 and 840 are wound parallel. The number of superconductor tapes helically wound beside each other in each layer of a superconductor cable can be the same as or different than the number of superconductor tapes helically wound beside each other in the other layers of the superconductor cable. In some embodiments, one layer of a superconductor cable may be formed of a single tape while one or more other layers of the superconductor cable may be formed of multiple tapes wound beside each other.

Figure 6:
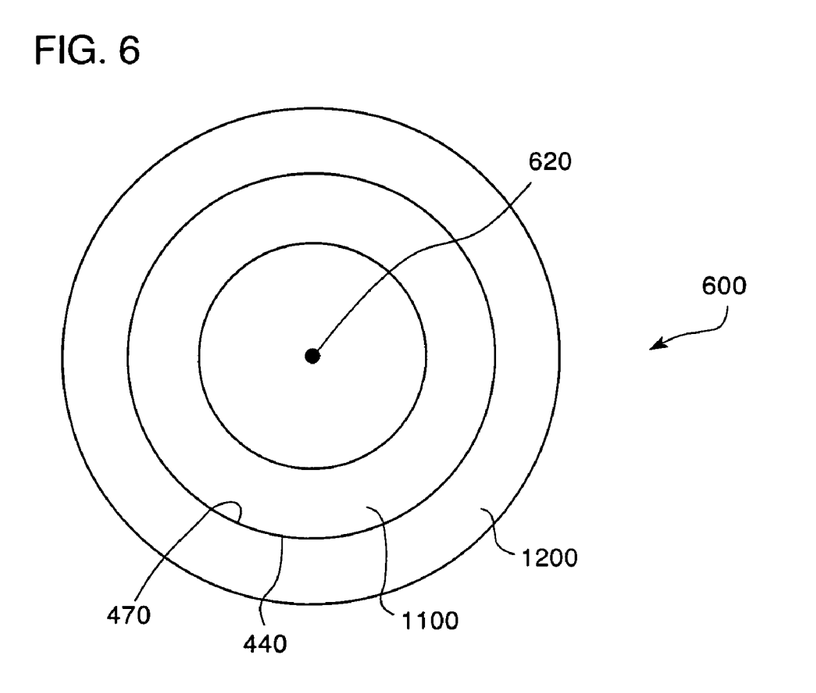
FIG. 6 is a cross-sectional view of an embodiment of a superconductor tape.

As another example, more than one (e.g., two, three, four, five, six, seven, eight, etc.) superconductor tapes can be stacked on top of each other and then helically wound around a helical axis in the same direction to form a layer of a superconductor tape. In such embodiments the superconductor tapes are stacked so that the tapes form pairs in which the stabilizer layers contact each other. FIG. 6 shows an embodiment of a layer of a cable 600 that is formed of two superconductor tapes 1100 and 1200 that are stacked on each other and helically wound around a helical axis 620 in the same direction. The number of superconductor tapes stacked on each other in each layer of superconductor cable 600 can be the same as or different than the number of superconductor tapes that are stacked on each other in the other layers of cable 600. Optionally, a layer of electrically insulating material can be wound positioned between tapes 1100 and 1200.

In some embodiments, cables having sufficient current transfer terminations can be relatively easily fabricated and the overall current density of the cable can be relatively high. As an example, the current density can be greater than about 6000 Amperes.

In certain embodiments, one or more of the tapes in a superconductor cable can have an electrically conductive stabilizer layer with a free surface, and the tape layers can be separated at the cable ends to expose the free surfaces. In some embodiments, one or more of the exposed free surface of the stabilizer layer(s) can be used as a terminal for current transfer into and/or out of the superconductor tape.

Figure 7A:
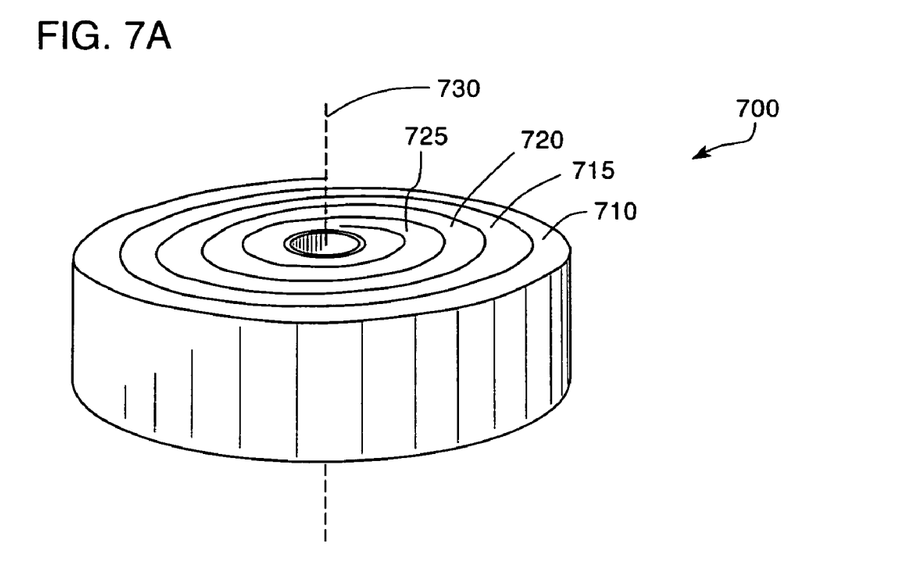
FIGS. 7A and 7B are perspective and plan views, respectively, of an embodiment of a superconductor magnetic coil.
Figure 7B:
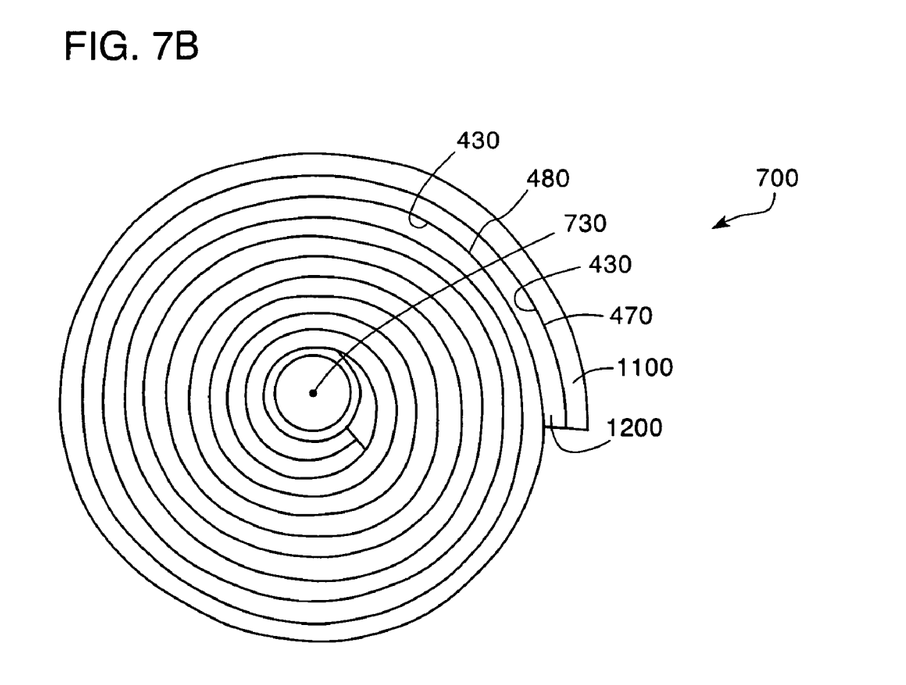

While the superconductor tapes described herein have been discussed with respect to their use in superconductor cables, the superconductor tapes can also be used in other applications, such as, for example, superconductor coils (e.g, magnetic coils). FIGS. 7A and 7B show perspective and plan views, respectively, of a superconductor coil 600 including multiple turns (710, 715, 720, 725, etc.) wound around coil axis 630 with each turn formed by superconductor tapes 1100 and 1200. Tapes 1100 and 1200 are generally not mechanically coupled, but may be mechanically coupled at their respective ends. In each turn of coil 600, surface 440 of tape 1100 contacts surface 470 of tape 1200 so that tapes 1100 and 1200 are in electrical communication. In addition, in adjacent turns of coil 600, surface 430 of tape 1100 contacts surface 480 of tape 1200 in the adjacent turn. In some embodiments, one or more materials (e.g., an electrically insulating material, such as an electrically insulating cloth) may be coiled between adjacent turns (e.g., between surfaces 430 and 480 of adjacent turns).

While embodiments of a superconductor coil having each turn formed of one superconductor tape pair have been described, the invention is not so limited. In general, a superconductor coil can have each turn formed of any desired number of superconductor tape pairs (e.g., two tape pairs, four tape pairs, six tape pairs, eight tape pairs, etc.). Typically, each tape pair within a turn is configured so that the stabilizer layers contact each other, so that the tapes within each tape pair are in electrical communication, and so that the substrates of adjacent tape pairs contact each other.

While the foregoing description has been with respect to superconductor tapes that include certain layers (substrate, buffer layer, superconductor layer, and stabilizer layer), the invention is not limited in this sense. A superconductor tape can include additional layers. In these embodiments, the layers are preferably arranged so that the superconductor layer(s) are below the neutral mechanical axis of the tape. In some embodiments, this can be achieved by using a stabilizer having a thickness that is about the same or greater than the combined thickness of the other layers in the tape. In certain embodiments, this can be achieved by using a substrate having a thickness that is about the same or greater than the combined thickness of the other layers in the tape.

In some embodiments, a superconductor tape can include more than one buffer layer (e.g., two buffer layers, three buffer layers, four buffer layers, etc.). The multiple buffer layers can be stacked on top of each other. In certain embodiments, a superconductor tape can include more than one superconductor layer. The multiple superconductor layers can be stacked on top of each other. A superconductor tape can include intercalated buffer layers and superconductor layers.

In some embodiments, a superconductor tape can include a cap layer between the superconductor layer and the stabilizer layer. The cap layer can, for example, be formed of an electrically conductive material that is less reactive with the superconductor material than the material from which the stabilizer layer is formed. Examples of material from which the solder can be formed include silver, gold, palladium and platinum.

In certain embodiments, a superconductor tape can include a solder layer between the cap layer and the stabilizer layer. The solder layer can, for example, assist in adhesion between the cap and stabilizer layers. Examples of materials from which the solder layer can be formed include certain lead-tin based solders (e.g., a solder containing about 62% lead, about 36% tin and about two percent silver, or a solder containing about 95% lead about five percent tin). Other appropriate solders are known to those skilled in the art.

In addition, while superconductor articles have been described in which the stabilizer layers of adjacent tapes are in contact, other embodiments are also possible. More generally, the stabilizer layers need not be in contact, but are preferably in electrical communication and arranged so that each tape has its own neutral mechanical axis. For example, a layer of material, such as a layer of an electrically conductive material that reduces friction between the adjacent stabilizer layers and/or a layer of an electrically conductive material that reduces oxidation of one or both of the adjacent stabilizer layers, can be located between the adjacent stabilizer layers. In some embodiments, a layer of graphite can be positioned between adjacent stabilizer layers. In certain embodiments, molybdenum disulfide can be positioned between adjacent stabilizer layers. In some embodiments, one or more adjacent stabilizer layers can contain (e.g., be impregnated with) an appropriate lubricant material, such as one or more greases (e.g., one or more electrically conductive greases). In certain embodiments, a hard layer (e.g., a thin, hard layer) of material (e.g., electrically conductive material, such as chrome, nickel and/or certain nitride materials) can be disposed between adjacent stabilizers (e.g., formed as an additional layer on top of one or both stabilizer layers).

In certain embodiments (e.g., when a tape is configured so that the stabilizer layer is facing the helical axis), the thickness of the is stabilizer is about the same or greater than the combined thickness of the substrate, buffer and superconductor layers. In some embodiments (e.g., when a tape is configured so that the stabilizer layer is facing away from the helical axis), the thickness of the is stabilizer is about the same or less than the thickness of the substrate less the thickness of the buffer layers less the thickness of the superconductor layers.

In general, when two layers are mechanically coupled, they can be mechanically coupled at points other than their ends. As an example, they can be mechanically coupled along the entire surfaces of contact. As another example, they can be intermittently mechanically coupled at points along their surfaces.

Other embodiments are in the claims.

What is claimed is:

1. An article, comprising:
    a first plurality of helically wound superconductor tapes, each tape in the first plurality of helically wound superconductor tapes including a layer of a superconductor material and a layer of an electrically conductive material, each tape in the first plurality of helically wound superconductor tapes being wound in parallel in a first direction; and
    a second plurality of helically wound superconductor tapes, each tape in the second plurality of helically wound superconductor tapes including a layer of a superconductor material and a layer of an electrically conductive material, each tape in the second plurality of helically wound superconductor tapes being wound in parallel in a second direction opposite the first direction,
    wherein the layer of the electrically conductive materials in each tape in the first plurality of tapes has more than one position of electrical communication with the layer of electrically conductive material in each tape of the second plurality of tapes.

2. The article of claim 1, wherein the first and second plurality of helically wound superconductor tapes have a common helical axis.

3. The article of claim 1, wherein the electrically conductive layers of each tape in the first plurality of superconductor tapes at least partially overlap with the electrically conductive layers of each tape in the second plurality of superconductor tapes.

4. The article of claim 1, wherein each of the tapes in the article has a different neutral mechanical axis when bent than a neutral mechanical axis of any of the other tapes when bent.

* * * * *

UNITED STATES PATENT AND TRADEMARK OFFICE
CERTIFICATE OF CORRECTION

PATENT NO. : 7,106,156 B2  Page 1 of 1
APPLICATION NO. : 11/104194
DATED : September 12, 2006
INVENTOR(S) : David M. Buczek, John D. Scudiere and Leslie G. Fritzemeier It is certified that error appears in the above-identified patent and that said Letters Patent is hereby corrected as shown below:

Title Page item 56
Please add the following Foreign Patent Documents and Other Publication to the list of References Cited. These references were cited in an information disclosure statement filed on January 13, 2006 and initialed by the Examiner on July 11, 2006,

FOREIGN PATENT DOCUMENTS

| Document Number | Publication Date |
| --- | --- |
| 3113256 | 09/22/2000 |
| 2001-0013227 | 02/26/2001 |
| 9-129040 | 05/16/2007 |

Signed and Sealed this

Third Day of June, 2008

JON W. DUDAS
*Director of the United States Patent and Trademark Office*